(12) United States Patent
Yukimura et al.

(10) Patent No.: US 9,341,528 B2
(45) Date of Patent: May 17, 2016

(54) TORQUE DETECTOR AND STEERING SYSTEM INCLUDING THE TORQUE DETECTOR

(71) Applicant: JTEKT CORPORATION, Osaka-shi, Osaka (JP)

(72) Inventors: Takahiro Yukimura, Kashiba (JP); Akihiro Takeuchi, Kashiba (JP); Yoji Yamashita, Kashiba (JP); Toshio Iida, Kashihara (JP); Takeshi Oishi, Kashihara (JP)

(73) Assignee: JTEKT CORPORATION, Osaka (JP)

( * ) Notice: Subject to any disclaimer, the term of this patent is extended or adjusted under 35 U.S.C. 154(b) by 108 days.

(21) Appl. No.: 14/108,776

(22) Filed: Dec. 17, 2013

(65) Prior Publication Data

US 2014/0174202 A1 Jun. 26, 2014

(30) Foreign Application Priority Data

Dec. 25, 2012 (JP) ................. 2012-281665

(51) Int. Cl.
*G01L 3/00* (2006.01)
*G01L 5/22* (2006.01)
*G01L 3/10* (2006.01)
*G01R 33/00* (2006.01)
*G01R 33/07* (2006.01)

(52) U.S. Cl.
CPC ............. *G01L 5/221* (2013.01); *G01L 3/104* (2013.01); *G01L 3/101* (2013.01); *G01R 33/0011* (2013.01); *G01R 33/072* (2013.01)

(58) Field of Classification Search
CPC .......... G01L 3/01; G01L 3/101; G01L 5/221; G01L 33/0011; G01L 33/072; B62D 6/10
USPC .............. 73/862.331–862.336; 324/207.2
See application file for complete search history.

(56) References Cited

U.S. PATENT DOCUMENTS

| | | | | |
|---|---|---|---|---|
| 6,928,887 B2 * | 8/2005 | Nakane et al. | ........... | 73/862.331 |
| 7,051,602 B2 * | 5/2006 | Nakane et al. | ........... | 73/862.333 |
| 7,428,847 B2 * | 9/2008 | Osuka et al. | ............ | 73/862.331 |
| 7,509,883 B2 * | 3/2009 | Murakami et al. | ....... | 73/862.331 |
| 7,568,400 B2 * | 8/2009 | Tokumoto et al. | ........ | 73/862.333 |

(Continued)

FOREIGN PATENT DOCUMENTS

| | | |
|---|---|---|
| EP | 2 423 655 A1 | 2/2012 |
| FR | 2 845 473 A1 | 4/2004 |
| JP | 2008249598 A1 * | 10/2008 |

OTHER PUBLICATIONS

Extended European Search Report issued in European Application No. 13198660.6 dated Mar. 25, 2014.

*Primary Examiner* — Lisa Caputo
*Assistant Examiner* — Jonathan Dunlap
(74) *Attorney, Agent, or Firm* — Oliff PLC

(57) ABSTRACT

A torque detector includes: a magnetic flux collecting unit including a magnetic flux collecting holder formed in an annular shape by resin molding and a magnetic shield formed by bending a metal plate and attached to an outer peripheral face of the magnetic flux collecting holder; and a sensor housing formed integrally with the magnetic flux collecting unit. The magnetic shield has a shield body, a shield end portion, and a bent portion. A second angle formed between an outer side face of the shield end portion and a radial direction is smaller than a first angle formed between an outer peripheral face of the shield body and the radial direction.

12 Claims, 10 Drawing Sheets

(56) References Cited

U.S. PATENT DOCUMENTS

| | | | |
|---|---|---|---|
| 7,707,900 B2* | 5/2010 | Ishihara et al. | 73/862.193 |
| 7,886,619 B2* | 2/2011 | Kaoku et al. | 73/862.331 |
| 8,806,962 B2* | 8/2014 | Shidahara et al. | 73/862.325 |
| 8,887,580 B2* | 11/2014 | Nishikawa et al. | 73/862.331 |
| 8,957,678 B2* | 2/2015 | Oota | 324/251 |
| 2004/0074316 A1 | 4/2004 | Nakane et al. | |
| 2005/0241414 A1 | 11/2005 | Nakane et al. | |
| 2007/0169569 A1* | 7/2007 | Osuka et al. | 73/862.331 |
| 2007/0180905 A1* | 8/2007 | Kaoku et al. | 73/331 |
| 2008/0028870 A1* | 2/2008 | Tokumoto et al. | 73/862.333 |
| 2009/0107259 A1* | 4/2009 | Ishihara et al. | 73/862.193 |
| 2010/0071481 A1 | 3/2010 | Arita et al. | |
| 2011/0221432 A1* | 9/2011 | Oota | 324/251 |
| 2013/0192390 A1* | 8/2013 | Shidahara et al. | 73/862.325 |
| 2013/0220030 A1* | 8/2013 | Nishikawa et al. | 73/862.331 |

* cited by examiner

TORQUE DETECTOR AND STEERING SYSTEM INCLUDING THE TORQUE DETECTOR

INCORPORATION BY REFERENCE

The disclosure of Japanese Patent Application No. 2012-281665 filed on Dec. 25, 2012 including the specification, drawings and abstract is incorporated herein by reference in its entirety.

BACKGROUND OF THE INVENTION

1. Field of the Invention

The invention relates to a torque detector including a magnetic flux collecting unit that collects magnetic fluxes from a magnetic yoke, and a sensor housing formed integrally with the magnetic flux collecting unit, and relates to a steering system including the torque detector.

2. Description of Related Art

A conventional torque detector includes a magnetic flux collecting unit including magnetic flux collecting rings, a ring holder and a magnetic shield, and a sensor housing. The torque detector is configured such that the magnetic flux collecting unit is fixed to the sensor housing with the magnetic flux collecting unit inserted in an insertion hole formed in the sensor housing. An example of such a conventional torque detector is described in Japanese Patent Application Publication No. 2008-249598.

In the conventional torque detector, there is a possibility that water may enter the torque detector through a gap between the magnetic flux collecting unit and the sensor housing. Therefore, in order to enhance the water-tightness of a torque detector, there has been proposed a torque detector 200 configured such that a sensor housing 220 is formed integrally with a magnetic flux collecting unit 210 by supplying resin onto the outer periphery of the magnetic flux collecting unit 210 as illustrated in FIG. 12.

The magnetic flux collecting unit 210 includes a magnetic flux collecting holder 211, a magnetic flux collecting ring 212 and a magnetic shield 213. In the magnetic flux collecting unit 210, the magnetic flux collecting ring 212 is fitted to an inner peripheral face 211X of the magnetic flux collecting holder 211, and the magnetic shield 213 is fitted to an outer peripheral face 211Y of the magnetic flux collecting holder 211.

The magnetic shield 213 is formed of a metal plate. The magnetic shield 213 has a C-shape in a planar view. The magnetic shield 213 is in contact, at its inner peripheral face 213X, with the outer peripheral face 211Y of the magnetic flux collecting holder 211. The magnetic shield 213 has a shield body 213A and shield end portions 213B. The magnetic shield 213 is configured such that the shield end portions 213B are continuous with respective end portions of the shield body 213A in the circumferential direction. In the magnetic shield 213, an angle formed between the shield body 213A and the radial direction of the sensor housing 220 (hereinafter, referred to as "first angle AR1") and an angle formed between each shield end portion 213B and the radial direction of the sensor housing 220 (hereinafter, referred to as "second angle AR2") are equal to each other. In the magnetic shield 213, the outer peripheral face of the shield body 213A and the outer peripheral face of each shield end portion 213B are orthogonal to the radial direction ZB of the sensor housing 220, and therefore, both the first angle AR1 and the second angle AR2 are 90°.

The sensor housing 220 is in close contact with an outer peripheral face 213Y of the magnetic shield 213 and corner portions 213D of the shield end portions 213B. The corner portions 213D of the shield end portions 213B are formed by end faces 213C of the shield end portions 213B and the outer peripheral face 213Y of the magnetic shield 213.

In the torque detector 200, the linear expansion coefficient of the sensor housing 220 is greater than the linear expansion coefficient of the magnetic shield 213. Therefore, when the temperature of the torque detector 200 changes, the amount of thermal expansion of the sensor housing 220 is greater than that of the magnetic shield 213, and the amount of thermal contraction of the sensor housing 220 is greater than that of the magnetic shield 213.

Accordingly, when the torque detector 200 is cooled, the sensor housing 220 presses the shield end portions 213B due to the difference between the thermal contraction amount of the sensor housing 220 and the thermal contraction amount of the magnetic shield 213. Specifically, the sensor housing 220 presses the outer peripheral face 213Y of the magnetic shield 213 radially inward, due to the difference between the amount of thermal contraction of the sensor housing 220 in the radial direction and the amount of thermal contraction of the magnetic shield 213 in the radial direction. Further, the sensor housing 220 presses the end faces 213C of the shield end portions 213B in the circumferential direction, due to the difference between the amount of thermal contraction of the sensor housing 220 in the circumferential direction and the amount of thermal contraction of the magnetic shield 213 in the circumferential direction.

As illustrated in FIG. 13, as the result of analysis conducted by the applicant according to the finite element method (FEM), the applicant found that a reaction force (hereinafter, referred to as "pressing reaction force") against the force with which the sensor housing 220 (refer to FIG. 2) presses the outer peripheral faces of the corner portions 213D of the shield end portions 213B radially inward, is greatest when the torque detector 200 is cooled. Thus, the sensor housing 220 is pressed radially outward by the outer peripheral faces of the corner portions 213D of the shield end portions 213B due to the pressing reaction force. As a result, large thermal stresses are generated in portions of the sensor housing 220, which surround the corner portions 213D of the shield end portions 213B from the outside in the radial direction.

SUMMARY OF THE INVENTION

One object of the invention is to provide a torque detector having a configuration that suppresses generation of large thermal stresses in portions of a sensor housing, which surround shield end portions from the outside in the radial direction, and a steering system including the torque detector.

A torque detector according to an aspect of the invention includes: a permanent magnet; a magnetic yoke that is arranged in a magnetic field created by the permanent magnet, and of which a position relative to the permanent magnet varies; a magnetic flux collecting unit including a magnetic flux collecting holder formed in an annular shape by resin molding and surrounding the magnetic yoke, a magnetic flux collecting ring that is attached to an inner peripheral face of the magnetic flux collecting holder and that collects magnetic fluxes of the magnetic yoke, and a magnetic shield formed by bending a metal plate and attached to an outer peripheral face of the magnetic flux collecting holder; a magnetic sensor that detects a magnetic flux of a magnetic circuit formed by the permanent magnet, the magnetic yoke and the magnetic flux collecting ring; and a sensor housing formed integrally with the magnetic flux collecting unit by resin supplied onto an outer periphery of the magnetic flux collecting unit. The magnetic shield has a shield body held between an inner face of the sensor housing and the outer peripheral face of the magnetic flux collecting holder, a shield end portion constituting an end portion of the metal plate in a circumferential direction, and a bent portion bent from the shield body and connecting the shield body and the shield end portion to each other. A second angle formed between an outer side face of the shield end portion and a radial direction of the sensor housing is smaller than a first angle formed between an outer peripheral face of the shield body and the radial direction of the sensor housing.

In the torque detector according to the above-described aspect, because the second angle is smaller than the first angle, the outer side face of the shield end portion of the magnetic shield is not orthogonal to the radial direction of the sensor housing. Thus, a force applied to the magnetic shield by the sensor housing in the radial direction due to the difference between the amount of thermal contraction of the sensor housing in the radial direction and the amount of thermal contraction of the magnetic shield in the radial direction is resolved, at the shield end portion, into a component force in a direction along the shield end portion and a component force that perpendicularly presses the shield end portion. The component force that perpendicularly presses the shield end portion is smaller than a force that perpendicularly presses a shield end portion 213B of a magnetic shield 213 in a torque detector 200 in FIG. 1. Thus, the pressing reaction force with which the shield end portion presses the sensor housing is smaller than that in the torque detector 200. Therefore, it is possible to suppress generation of a large thermal stress in a portion of the sensor housing, which surrounds the shield end portion from the outside in the radial direction.

The torque detector according to the above-described aspect may be used as a torque detector for a steering system.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
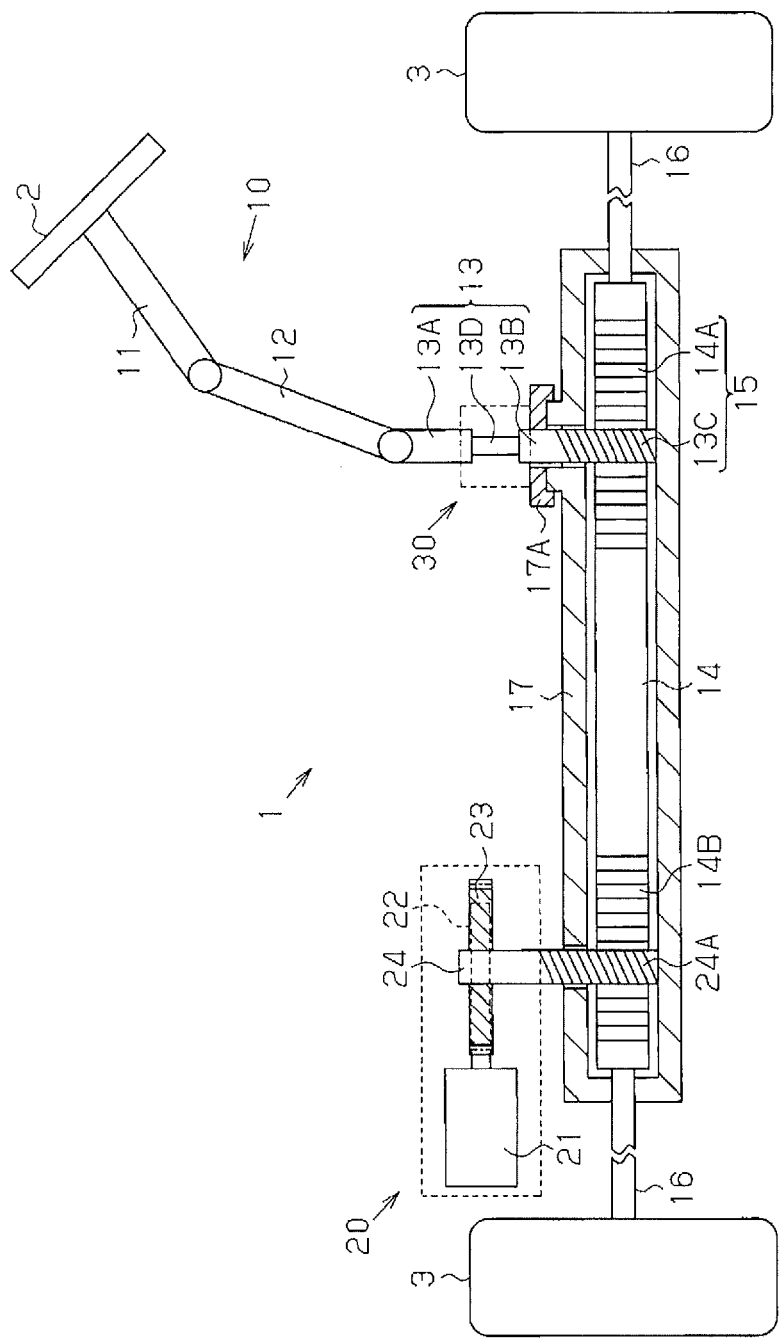
FIG. 1 is a view schematically illustrating the configuration of a steering system according to a first embodiment of the invention.

Hereinafter, embodiments of the invention will be described with reference to the accompanying drawings. With reference to FIG. 1, the configuration of a steering system 1 will be described. The steering system 1 includes a steering system body 10, an assist device 20 and a torque detector 30. The steering system 1 has a configuration as an electric power steering system of a dual pinion assist type, which assists a driver in operating the steering wheel 2 with the use of the assist device 20.

The steering system body 10 includes a column shaft 11, an intermediate shaft 12, a pinion shaft 13, a rack shaft 14, a rack-and-pinion mechanism 15, two tie rods 16 and a rack housing 17. In the steering system body 10, the column shaft 11, the intermediate shaft 12 and the pinion shaft 13 are rotated together with each other as the steering wheel 2 is turned. In the steering system body 10, the rack shaft 14 is reciprocated in its longitudinal direction by the rotation of the pinion shaft 13. The steering system body 10 changes the steered angle of steered wheels 3 by reciprocating the rack shaft 14.

The pinion shaft 13 includes a first shaft 13A, a second shaft 13B and a torsion bar 13D. In the pinion shaft 13, the torsion bar 13D connects the first shaft 13A and the second shaft 13B to each other.

The first shaft 13A is connect to the intermediate shaft 12. The first shaft 13A is rotated together with the intermediate shaft 12. The second shaft 13B has a pinion gear 13C. The second shaft 13B is meshed at the pinion gear 13C with a first rack gear 14A of the rack shaft 14.

The rack shaft 14 has the first rack gear 14A and a second rack gear 14B. The first rack gear 14A has a plurality of rack teeth formed over a prescribed range in the longitudinal direction of the rack shaft 14. The second rack gear 14B is formed in the rack shaft 14, at a portion which is apart from the first rack gear 14A. The second rack gear 14B has a plurality of rack teeth formed over a prescribed range in the longitudinal direction of the rack shaft 14.

The rack-and-pinion mechanism 15 includes the pinion gear 13C of the pinion shaft 13 and the first rack gear 14A of the rack shaft 14. The rack-and-pinion mechanism 15 converts the rotation of the pinion shaft 13 into a reciprocating motion of the rack shaft 14.

The rack housing 17 has a tubular shape. The pinion shaft 13, the rack shaft 14 and part of each tie rod 16 are accommodated in an internal space of the rack housing 17.

The assist device 20 includes an assist motor 21, a worm shaft 22, a worm wheel 23 and a pinion shaft 24. In the assist device 20, an output shaft of the assist motor 21 is coupled to the worm shaft 22. In the assist device 20, the worm shaft 22 and the worm wheel 23 are meshed with each other. In the assist device 20, the worm wheel 23 is rotated together with the pinion shaft 24. In the assist device 20, a pinion gear 24A of the pinion shaft 24 is meshed with the second rack gear 14B. In the assist device 20, the speed of rotation output from the assist motor 21 is reduced by the worm shaft 22 and the worm wheel 23, and the rotation with a reduced speed is transmitted to the pinion shaft 24 to rotate the pinion shaft 24. Thus, the force that acts in the longitudinal direction of the rack shaft 14 is applied to the rack shaft 14.

The torque detector 30 is arranged around the pinion shaft 13. The torque detector 30 is fixed to a fixing member 17A of the rack housing 17. The torque detector 30 detects a torque that is applied to the pinion shaft 13.

Figure 2:
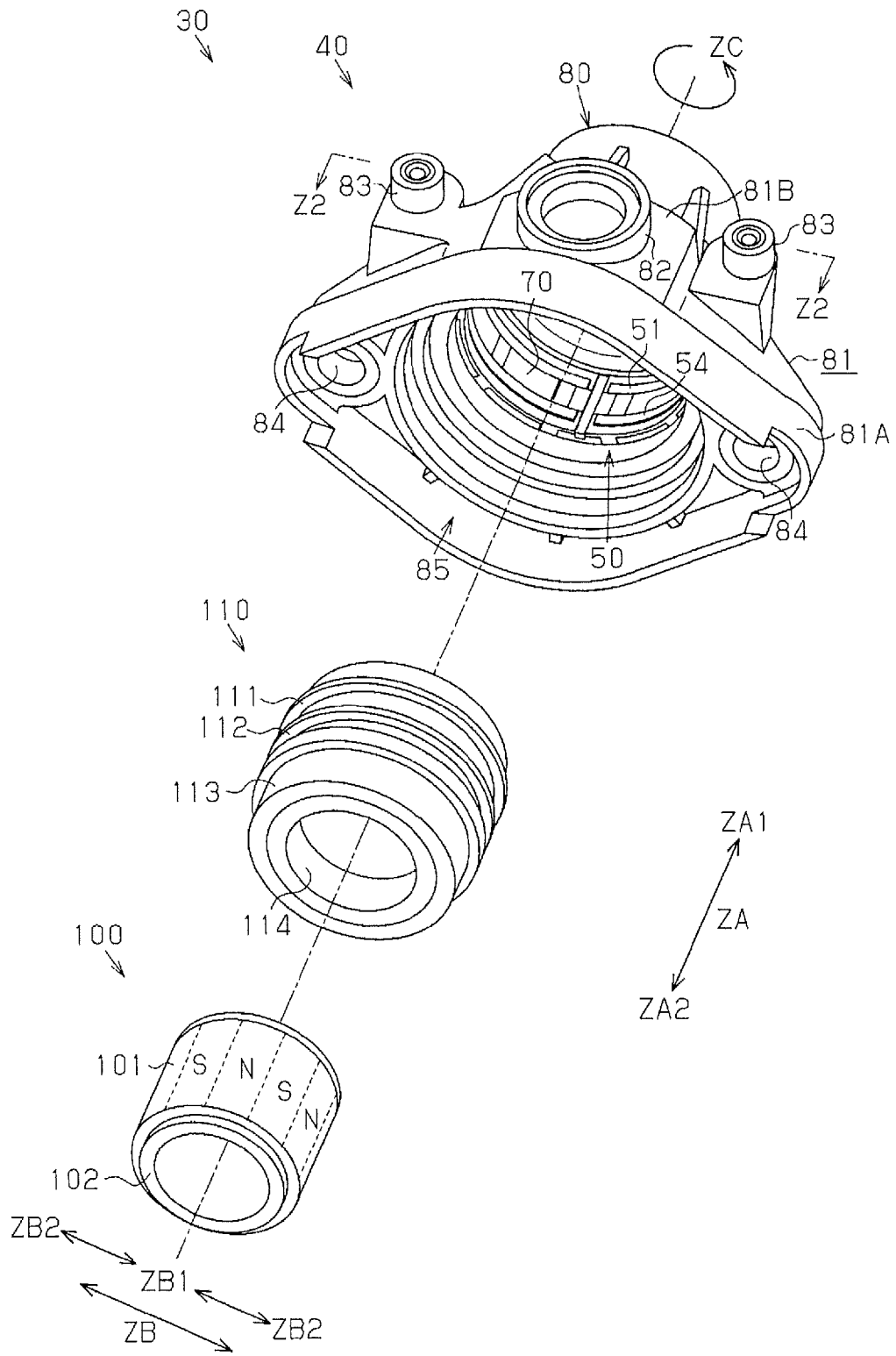
FIG. 2 is a perspective view illustrating the exploded perspective configuration of the torque detector according to the first embodiment.

The configuration of the torque detector 30 will be described with reference to FIG. 2 and FIG. 3. FIG. 2 illustrates a sensor unit 40 from which a substrate unit 90 is omitted. The directions with regard to the torque detector 30 will be defined as an axial direction ZA, a rack separating direction ZA1, a rack approaching direction ZA2, a radial direction ZB, an inward direction ZB1, an outward direction ZB2 and a circumferential direction ZC. The radial direction ZB coincides with the radial direction of the sensor housing. The circumferential direction coincides with the circumferential direction of the magnetic flux collecting unit.

Figure 3:
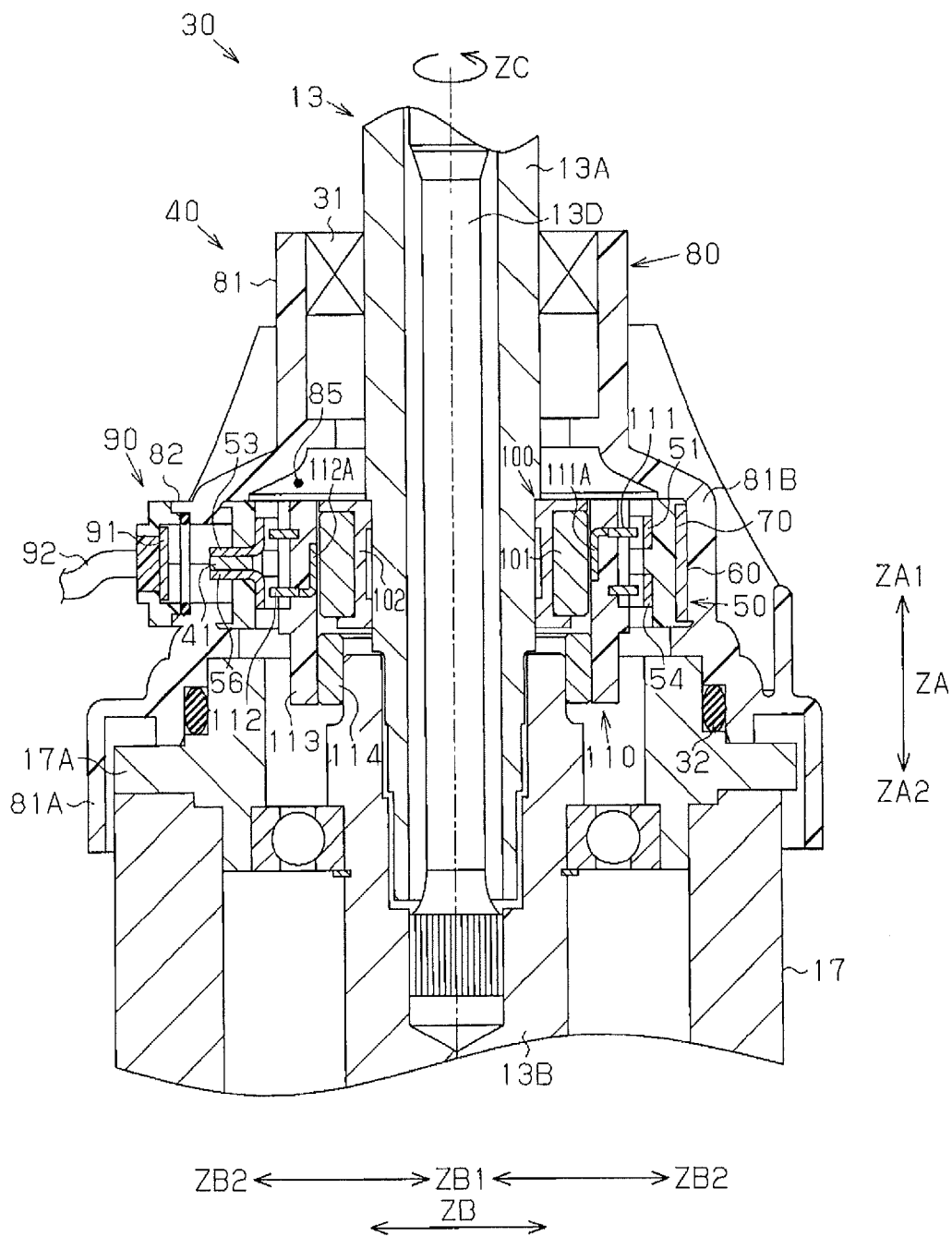
FIG. 3 is a sectional view illustrating the sectional configuration of the torque detector according to the first embodiment.

The circumferential direction ZC indicates the direction around the axis of rotation of the pinion shaft 13 (refer to FIG. 3). The axial direction ZA indicates the direction along the axis of rotation of the pinion shaft 13. The axial direction ZA is defined by the rack separating direction ZA1 and the rack approaching direction ZA2 that are the directions opposite from each other. The rack separating direction ZA1 indicates the direction away from the rack shaft 14 (refer to FIG. 1). The rack approaching direction ZA2 indicates the direction toward the rack shaft 14.

The radial direction ZB indicates the direction normal to the axial direction ZA. The radial direction ZB is defined by the inward direction ZB1 and the outward direction ZB2 that are the directions opposite from each other. The inward direction ZB1 indicates the direction toward the axis of rotation of the pinion shaft 13. The outward direction ZB2 indicates the direction away from the axis of rotation of the pinion shaft 13.

As illustrated in FIG. 2, the torque detector 30 includes the sensor unit 40, a magnet unit 100 and a magnetic yoke unit 110. The torque detector 30 is configured such that the magnet unit 100 and the magnetic yoke unit 110 are accommodated in an internal space 85 of the sensor unit 40.

As illustrated in FIG. 3, a gap between the torque detector 30 and the first shaft 13A is sealed by an oil seal 31. Further, a gap between the torque detector 30 and the fixing member 17A of the rack housing 17 is sealed by an O-ring 32.

The magnet unit 100 is fixed to the first shaft 13A. The magnet unit 100 includes a permanent magnet 101 and a core 102. The magnet unit 100 is an assembly formed by coupling the permanent magnet 101 and the core 102 to each other.

The permanent magnet 101 has a cylindrical shape. The permanent magnet 101 is configured such that north poles and south poles are alternately arranged so as to be adjacent to each other in the circumferential direction ZC (refer to FIG. 2). The permanent magnet 101 creates a magnetic field around the first shaft 13A.

The core 102 is fixed to an inner peripheral face of the permanent magnet 101. The core 102 is press-fitted on an outer peripheral face of the first shaft 13A. The core 102 restrains the magnetic flux of the permanent magnet 101 from leaking in the inward direction ZB1 beyond the core 102.

The magnetic yoke unit 110 is arranged so as to surround the magnet unit 100. The magnetic yoke unit 110 is fixed to the second shaft 13B. The magnetic yoke unit 110 has a first magnetic yoke 111, a second magnetic yoke 112, a yoke holder 113 and an intermediate member 114.

The yoke holder 113 is formed, by resin molding, integrally with the first magnetic yoke 111 and the second magnetic yoke 112. The yoke holder 113 has a cylindrical shape. The yoke holder 113 is fixed to the second shaft 13B via the intermediate member 114.

The first magnetic yoke 111 has an annular shape. The first magnetic yoke 111 is located at a rack separating direction ZA1-side portion of the yoke holder 113. The first magnetic yoke 111 has a plurality of teeth 111A and a plurality of connection portions 111B (refer to FIG. 8). In the first magnetic yoke 111, each of the teeth 111A has such a tapered shape as to be tapered in the rack approaching direction ZA2 (refer to FIG. 8). The first magnetic yoke 111 is configured such that the teeth 111A that are adjacent to each other in the circumferential direction ZC are connected to each other by the connection portions 111B. The first magnetic yoke 111 receives the magnetic flux of the permanent magnet 101. The first magnetic yoke 111 forms a magnetic circuit in which the magnetic flux density varies depending on a variation in the relative position between the first magnetic yoke 111 and the permanent magnet 101 due to torsion of the torsion bar 13D.

The second magnetic yoke 112 has an annular shape. The second magnetic yoke 112 is located at a rack approaching direction ZA2-side portion of the yoke holder 113. The second magnetic yoke 112 has a plurality of teeth 112A and a plurality of connection portions 112B (refer to FIG. 8). In the second magnetic yoke 112, each of the teeth 112A has such a tapered shape as to be tapered in the rack separating direction ZA1 (refer to FIG. 8). The second magnetic yoke 112 is configured such that the teeth 112A that are adjacent to each other in the circumferential direction ZC are connected to each other by the connection portions 112B. The teeth 112A of the second magnetic yoke 112 are located between the teeth 111A that are adjacent to each other in the circumferential direction ZC. The second magnetic yoke 112 receives the magnetic flux of the permanent magnet 101. The second magnetic yoke 112 forms a magnetic circuit in which the magnetic flux density varies depending on a variation in the relative position between the second magnetic yoke 112 and the permanent magnet 101 due to torsion of the torsion bar 13D.

The sensor unit 40 is fixed to the fixing member 17A of the rack housing 17 with first bolts (not illustrated). The sensor unit 40 has two magnetic sensors 41 that are Hall ICs, a magnetic flux collecting unit 50, a sensor housing 80 and a substrate unit 90.

The magnetic flux collecting unit 50 is arranged so as to surround the magnet unit 100 and the magnetic yoke unit 110. The magnetic flux collecting unit 50 has an annular shape centering on the axis of rotation of the pinion shaft 13. The magnetic flux collecting unit 50 includes a first magnetic flux collecting ring 51, a second magnetic flux collecting ring 54, a magnetic shield 60 and a magnetic flux collecting holder 70. The magnetic flux collecting unit 50 is an assembly formed by fitting the magnetic flux collecting rings 51, 54 and the magnetic shield 60 to the magnetic flux collecting holder 70. The magnetic flux collecting unit 50 collects the magnetic fluxes of the magnetic yoke unit 110, and directs the magnetic fluxes to the magnetic sensors 41.

The two magnetic sensors 41 are adjacent to each other in the circumferential direction ZC. The magnetic sensors 41 detect the magnetic fluxes of the magnetic circuits formed of the permanent magnet 101, the magnetic yokes 111, 112 and the magnetic flux collecting rings 51, 54. The magnetic sensors 41 output voltages corresponding to the magnetic flux densities of the magnetic circuits. The voltages output from the magnetic sensors 41 are transmitted to a controller (not illustrated) for the steering system 1 (refer to FIG. 1).

As illustrated in FIG. 2, the sensor housing 80 formed, by resin molding, integrally with the magnetic flux collecting unit 50. The sensor housing 80 has a housing body 81, a substrate support portion 82, substrate attached portions 83, unit attached portions 84 and the internal space 85. The sensor housing 80 is configured such that the housing body 81, the substrate support portion 82, the substrate attached portions 83 and the unit attached portions 84 are integrally formed from a single resin material.

The housing body 81 has a cylindrical shape centering on the axis of rotation of the pinion shaft 13. The housing body 81 has a base portion 81A, a magnetic flux storage portion 81B and the internal space 85. The housing body 81 is configured such that the base portion 81A and the magnetic flux storage portion 81B are integrally formed from the single resin material. In the housing body 81, the magnetic flux storage portion 81B is located at a rack separating direction ZA1-side portion of the base portion 81A. In the housing body 81, the base portion 81A is formed in an elliptical shape in a planar view of the sensor housing 80.

The substrate attached portions 83 are located on the respective sides of the substrate support portion 82 in a planar view of the sensor housing 80. The substrate attached portions 83 have through-holes into which second bolts (not illustrated) are inserted.

The unit attached portions 84 are located at the respective end portions of the base portion 81A of the housing body 81 in the longitudinal direction, in a planar view of the sensor housing 80. The unit attached portions 84 have through-holes into which the first bolts are inserted.

The substrate support portion 82 has a cylindrical shape. The substrate support portion 82 is formed at the magnetic flux storage portion 81B of the housing body 81. The substrate support portion 82 projects from the housing body 81 in the outward direction ZB2.

As illustrated in FIG. 3, the substrate unit 90 includes a circuit substrate 91 and a lead wire 92. The substrate unit 90 outputs voltage signals received from the magnetic sensors 41, to the controller (not illustrated). The circuit substrate 91 has a flat plate-shape in a side view as viewed from the substrate support portion 82 of the sensor housing 80. The magnetic sensors 41 are attached to the circuit substrate 91. The lead wire 92 is attached to a face of the circuit substrate 91, which is on the opposite side of the circuit substrate 91 from the face to which the magnetic sensors 41 are attached.

Figure 4:
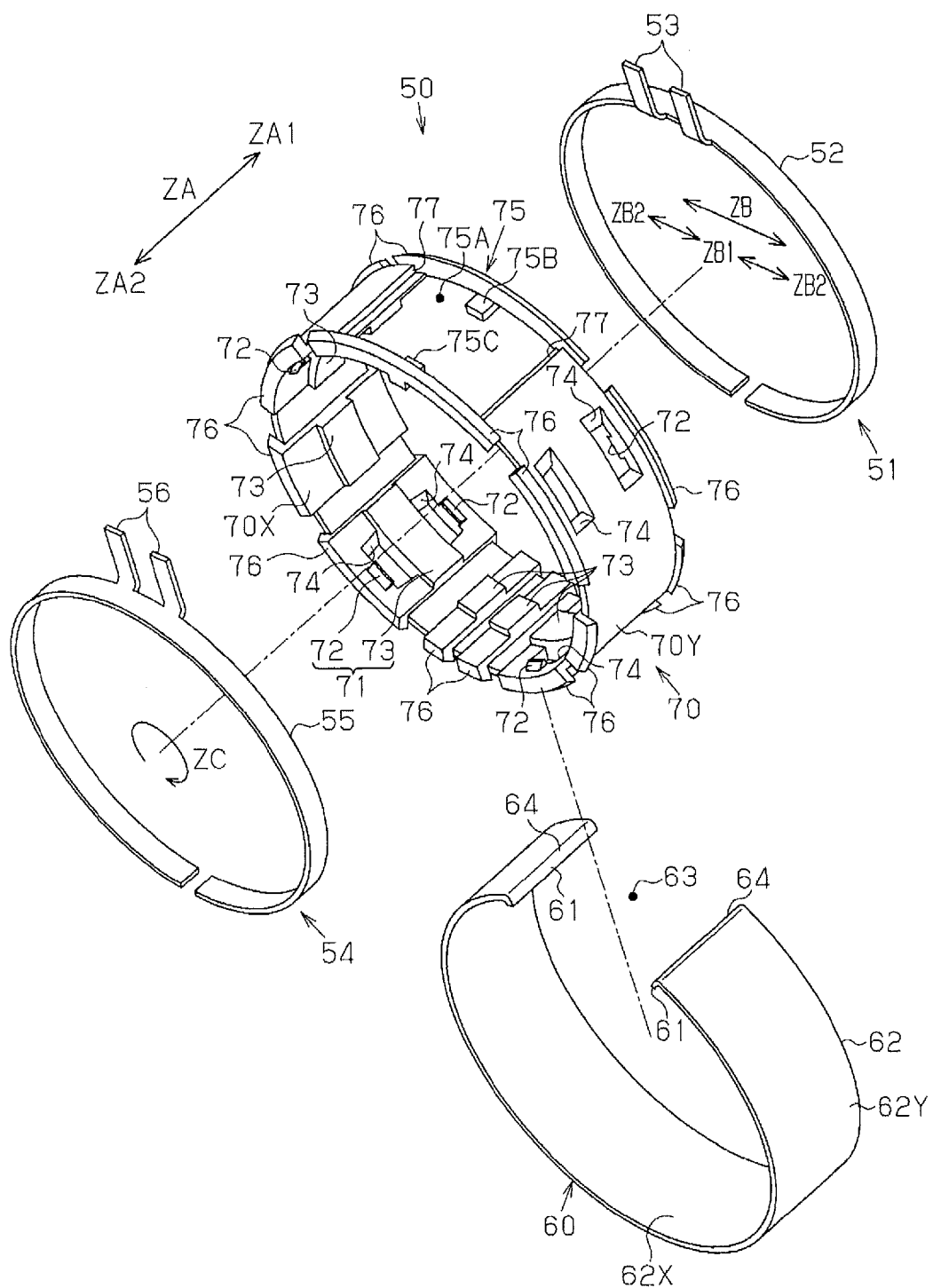
FIG. 4 is a perspective view illustrating the exploded perspective configuration of a magnetic flux collecting unit according to the first embodiment.

With reference to FIG. 4, the configuration of the magnetic flux collecting unit 50 will be described in detail. The magnetic flux collecting unit 50 includes the first magnetic flux collecting ring 51, the second magnetic flux collecting ring 54, the magnetic shield 60 and the magnetic flux collecting holder 70. The magnetic flux collecting unit 50 is an assembly formed by coupling the first magnetic flux collecting ring 51, the second magnetic flux collecting ring 54, the magnetic shield 60 and the magnetic flux collecting holder 70 to each other.

The first magnetic flux collecting ring 51 is formed by bending a long metal plate. The first magnetic flux collecting ring 51 is opposed, across a gap, to an outer peripheral portion of the first magnetic yoke 111 (refer to FIG. 3) in the radial direction ZB. The first magnetic flux collecting ring 51 has a ring body 52 and two magnetic flux collecting protrusions 53. The first magnetic flux collecting ring 51 is configured such that the ring body 52 and the two magnetic flux collecting protrusions 53 are formed integrally with each other. The first magnetic flux collecting ring 51 collects the magnetic fluxes from the first magnetic yoke 111.

The ring body 52 has an annular shape with a gap. The magnetic flux collecting protrusions 53 are adjacent to each other in the circumferential direction ZC. The magnetic flux collecting protrusions 53 each have such a shape as to extend from a rack approaching direction ZA2-side portion of the ring body 52 in the outward direction ZB2. The magnetic flux collecting protrusions 53 are opposed, in the axial direction ZA, to rack separating direction ZA1-side faces of the magnetic sensors 41 (refer to FIG. 3).

The second magnetic flux collecting ring 54 is formed by bending a long metal plate that is identical to the long metal plate from which the first magnetic flux collecting ring 51 is formed. The second magnetic flux collecting ring 54 is opposed, across a gap, to an outer peripheral portion of the second magnetic yoke 112 (refer to FIG. 3) in the radial direction ZB. The second magnetic flux collecting ring 54 has a ring body 55 and two magnetic flux collecting protrusions 56. The second magnetic flux collecting ring 54 is configured such that the ring body 55 and the two magnetic flux collecting protrusions 56 are formed integrally with each other. The second magnetic flux collecting ring 54 collects the magnetic fluxes of the second magnetic yoke 112.

The ring body 55 has an annular shape with a gap. The magnetic flux collecting protrusions 56 are adjacent to each other in the circumferential direction ZC. The magnetic flux collecting protrusions 56 each have such a shape as to extend from a rack separating direction ZA1-side portion of the ring body 54 in the outward direction ZB2. The magnetic flux collecting protrusions 56 are opposed, in the axial direction ZA, to rack approaching direction ZA2-side faces of the magnetic sensors 41.

The magnetic shield 60 is formed by bending a single long metal plate that is a magnetic material. The magnetic shield 60 has shield end portions 61, a shield body 62, a gap 63 and bent portions 64. The magnetic shield 60 is configured such that the bent portions 64 extend in the inward direction ZB1 from the ends of the shield body 62 in the circumferential direction ZC to connect the shield body 62 to the shield end portions 61. The magnetic shield 60 is configured such that the shield end portions 61 constitute end portions of the long plate in its longitudinal direction. The magnetic shield 60 is configured such that the shield body 62 is formed in a C-shape. The magnetic shield 60 is configured such that the gap 63 is formed between the shield end portions 61 that are adjacent to each other in the circumferential direction ZC. The magnetic shield 60 reduces the influence of the magnetic fields outside the torque detector 30 on the magnetic circuits constituted by the magnetic flux collecting rings 51, 54, the magnetic yokes 111, 112 and the permanent magnet 101 (refer to FIG. 3).

The magnetic flux collecting holder 70 is made of a resin material. The magnetic flux collecting holder 70 has an annular shape, and is opened at both sides in the axial direction ZA. The magnetic flux collecting holder 70 has an internal space in which the magnet unit 100 and the magnetic yoke unit 110 (refer to FIG. 3) are accommodated. The magnetic flux collecting holder 70 has a holding protrusion 71, through-holes 74, an insertion portion 75, a plurality of restricting walls 76, two accommodation portions 77 and two holder positioning portions 78 (refer to FIG. 6). The magnetic flux collecting holder 70 holds the first magnetic flux collecting ring 51, the second magnetic flux collecting ring 54 and the magnetic shield 60.

The holding protrusion 71 projects from an inner peripheral face 70X of the magnetic flux collecting holder 70 in the inward direction ZB1. The holding protrusion 71 has a plurality of first holding portions 72 and a plurality of second holding portions 73. The holding protrusion 71 has a function of holding the magnetic flux collecting rings 51, 54, at the first holding portions 72 and the second holding portions 73.

The first holding portions 72 are located on the inner peripheral face 70X of the magnetic flux collecting holder 70, at portions on the opposite sides of the second holding portions 73 in the axial direction ZA. The first holding portions 72 face the second holding portions 73 across gaps in the axial direction ZA. Each second holding portion 73 is formed in a circular arc shape as viewed in a planar view of the magnetic flux collecting holder 70. The second holding portions 73 are located on the inner peripheral face 70X of the magnetic flux collecting holder 70, at the center in the axial direction ZA.

The through-holes 74 pass through the magnetic flux collecting holder 70 in the radial direction ZB. The through-holes 74 are located at portions between the first holding portions 72 and the second holding portions 73 in the magnetic flux collecting holder 70. The through-holes 74 are formed to position a slide core (not illustrated) for forming the first holding portions 72, in dies for molding the magnetic flux collecting holder 70.

The insertion portion 75 has an insertion hole 75A that passes through the magnetic flux collecting holder 70 in the radial direction ZB, a first protrusion 75B and a second protrusion 75C. The insertion hole 75A of the insertion portion 75 is defined by part of the restricting walls 76 and the accommodation portions 77.

The first protrusion 75B serves as a mark for positioning the first magnetic flux collecting ring 51 with respect to the magnetic flux collecting holder 70 in the circumferential direction ZC. The second protrusion 75C serves as a mark for positioning the second magnetic flux collecting ring 54 with respect to the magnetic flux collecting holder 70 in the circumferential direction ZC.

The restricting walls 76 are formed at opposite end portions of the magnetic flux collecting holder 70 in the axial direction ZA. The restricting walls 76 project from an outer peripheral face 70Y of the magnetic flux collecting holder 70 in the outward direction ZB2. The restricting walls 76 are opposed, in the axial direction ZA, to end faces of the magnetic shield 60 in the axial direction ZA. The restricting walls 76 restrict displacement of the magnetic shield 60 relative to the magnetic flux collecting holder 70 in the axial direction ZA.

The accommodation portions 77 are adjacent to the insertion portion 75 in the circumferential direction ZC. Each of the accommodation portions 77 has such a stepped shape that a portion on the insertion hole 75A side in the circumferential direction ZC is recessed in the inward direction ZB1. The accommodation portions 77 are formed so as to extend from the restricting wall 76 on the rack separating direction ZA1 side, to the restricting wall 76 on the rack approaching direction ZA2 side.

Figure 5:
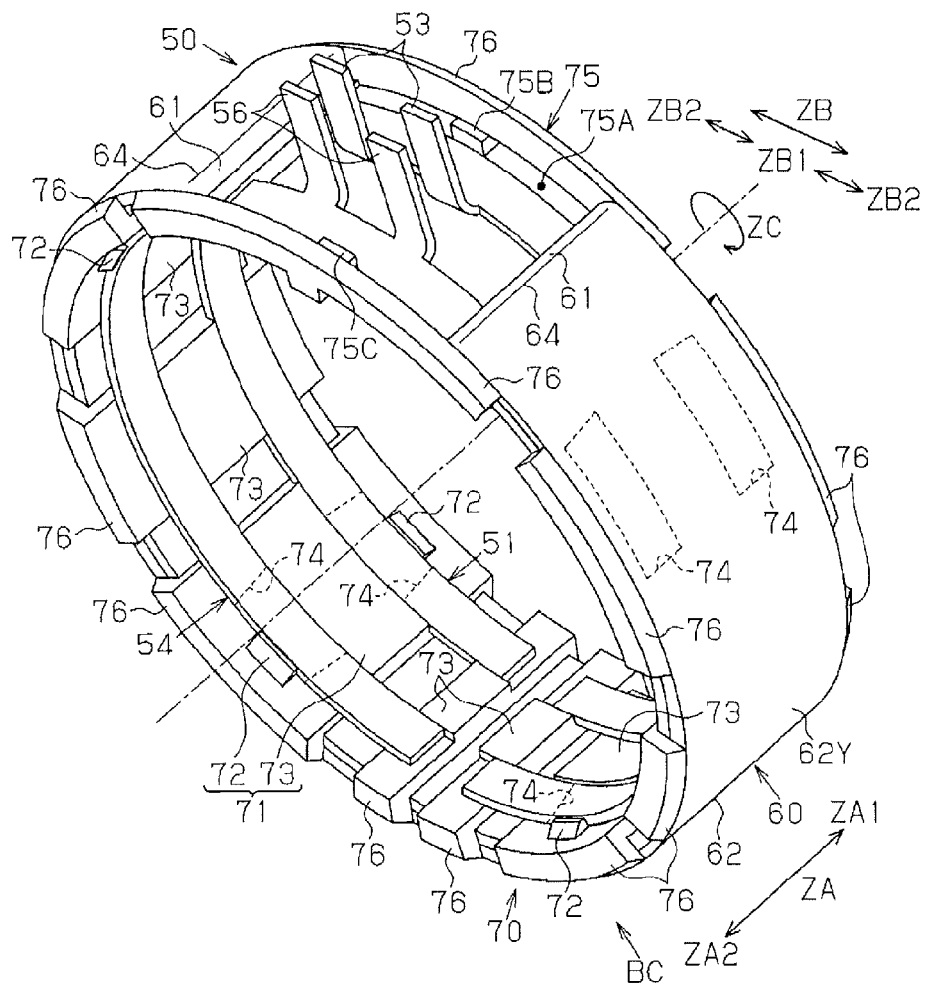
FIG. 5 is a perspective view illustrating the exploded perspective configuration of the magnetic flux collecting unit according to the first embodiment.
Figure 6:
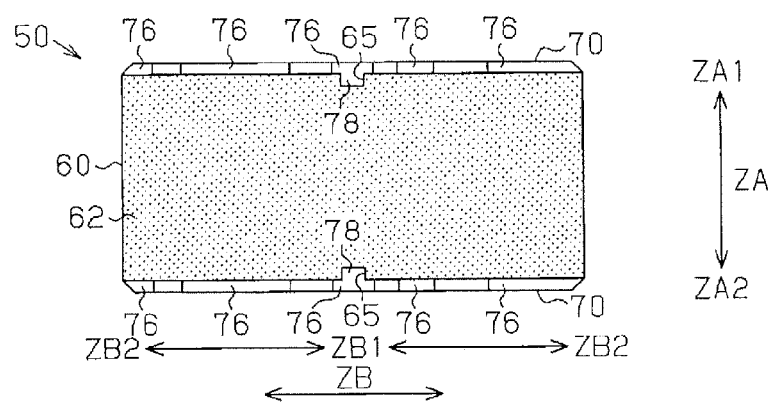
FIG. 6 is a side view illustrating the magnetic flux collecting unit according to the first embodiment, and illustrating the side structure as viewed from a direction indicated by an arrow BC in FIG. 5.

With reference to FIG. 5 and FIG. 6, description will be provided on the configuration in which the first magnetic flux collecting ring 51, the second magnetic flux collecting ring 54 and the magnetic shield 60 are attached to the magnetic flux collecting holder 70. As illustrated in FIG. 5, the first magnetic flux collecting ring 51 is held between the first holding portions 72 on the rack separating direction ZA1 side, and the second holding portions 73. The first magnetic flux collecting ring 51 covers the through-holes 74 on the rack separating direction ZA1 side, from the side in the inward direction ZB1 of the magnetic flux collecting holder 70. The magnetic flux collecting protrusions 53 of the first magnetic flux collecting ring 51 pass through the insertion portion 75 and project in the outward direction ZB2 beyond the magnetic flux collecting holder 70.

The second magnetic flux collecting ring 54 is held between the first holding portions 72 on the rack approaching direction ZA2 side, and the second holding portions 73. The second magnetic flux collecting ring 54 covers the through-holes 74 on the rack approaching direction ZA2 side, from the side in the inward direction ZB1 of the magnetic flux collecting holder 70. The magnetic flux collecting protrusions 56 of the second magnetic flux collecting ring 54 pass through the insertion portion 75 and project in the outward direction ZB2 beyond the magnetic flux collecting holder 70.

An inner peripheral face 62X (refer to FIG. 4) of the shield body 62 of the magnetic shield 60 is in contact with the outer peripheral face 70Y (FIG. 4) of the magnetic flux collecting holder 70. The magnetic shield 60 covers all the through-holes 74 from the side in the outward direction ZB2 of the magnetic flux collecting holder 70.

As illustrated in FIG. 6, the holder positioning portions 78 of the magnetic flux collecting holder 70 are formed integrally with the restricting walls 76. The holder positioning portions 78 are formed as protrusions that extend from the restricting walls 76 toward the magnetic shield 60 in the axial direction ZA.

The magnetic shield 60 is fitted at shield positioning portions 65 to the holder positioning portions 78. The magnetic shield 60 is configured such that the shield positioning portions 65 are formed as recessed portions that are recessed in the axial direction ZA from the axial direction ZA-side end faces of the magnetic shield 60. When the shield positioning portions 65 of the magnetic shield 60 are brought into contact, in the circumferential direction ZC, with the holder positioning portions 78 of the magnetic flux collecting holder 70, changes in the relative position between the magnetic shield 60 and the magnetic flux collecting holder 70 in the circumferential direction ZC are restricted.

Figure 7A:
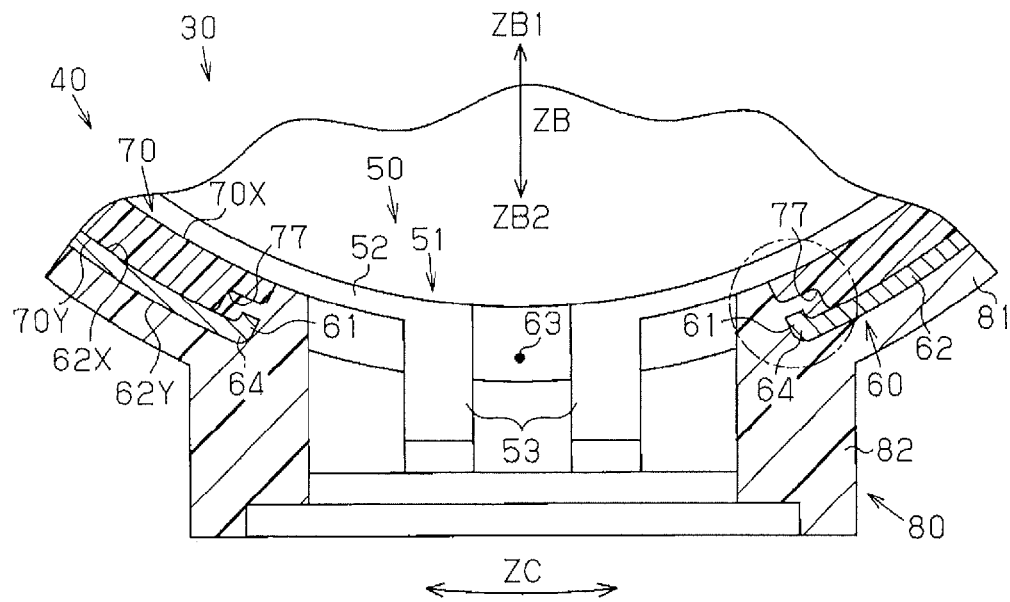
FIG. 7A is a sectional view illustrating a sensor unit according to the first embodiment, and illustrating the sectional configuration of a substrate support portion of a sensor housing and its surroundings in a section taken along the line Z2-Z2 in FIG. 2.
Figure 7B:
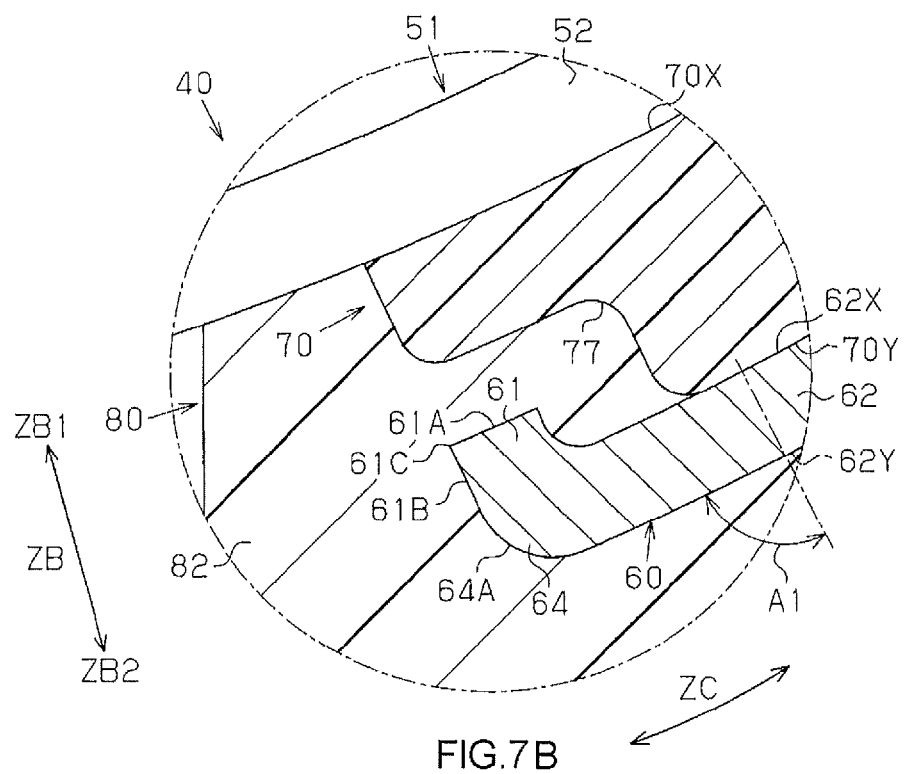
FIG. 7B is a sectional view illustrating the sensor unit according to the first embodiment, and an enlarged view illustrating the configuration of a portion indicated by a dashed line circle in FIG. 7A.

With reference to FIG. 7A and FIG. 7B, the detailed configuration of the shield end portions 61 of the magnetic shield 60 and its surroundings will be described. A first angle A1 is an angle formed between an outer peripheral face 62Y of the shield body 62 and the radial direction ZB. A second angle A2 is an angle formed between an outer side face 61B of each shield end portion 61 and the radial direction ZB.

As illustrated FIG. 7A, each shield end portion 61 is opposed to a corresponding one of the accommodation portions 77 of the magnetic flux collecting holder 70 in the radial direction ZB. The shield body 62 is held between the outer peripheral face 70Y of the magnetic flux collecting holder 70 and an inner face 81C of the housing body 81 of the sensor housing 80.

As illustrated in FIG. 7B, an end face 61A of the shield end portion 61 is opposed to the accommodation portion 77 across a gap in the radial direction ZB. The end face 61A of the shield end portion 61 is located inward of both the outer peripheral face 62Y of the shield body 62 and the outer peripheral face 70Y of the magnetic flux collecting holder 70 in the inward direction ZB1.

In the magnetic shield 60, the second angle A2 is smaller than the first angle A1. Note that, because the outer peripheral face 62Y of the shield body 62 of the magnetic shield 60 in the present embodiment is orthogonal to the radial direction ZB, the first angle A1 is 90°. Further, because the outer side face 61B of the shield end portion 61 of the magnetic shield 60 is parallel to the radial direction ZB, the second angle A2 is 0°.

The sensor housing 80 is in close contact with the outer peripheral face 62Y of the shield body 62 of the magnetic shield 60, the outer side faces 64A of the bent portions 64, the outer side faces 61B of the shield end portions 61 and corner portions 61C of the shield end portions 61. The sensor housing 80 fills the space between the shield end portions 61 and the accommodation portions 77 in the radial direction ZB.

With reference to FIG. 7A and FIG. 7B, the operation of the torque detector 30 will be described. Because the linear expansion coefficient of the sensor housing 80 is greater than that of the magnetic shield 60, the amount of thermal contraction of the sensor housing 80 in the circumferential direction ZC is greater than that of the magnetic shield 60 in the circumferential direction ZC. Further, the amount of thermal contraction of the sensor housing 80 in the radial direction ZB is greater than that of the magnetic shield 60 in the radial direction ZB. Therefore, a force (hereinafter, referred to as "first pressing force") is applied by the sensor housing 80 to the magnetic shield 60 in the radial direction ZB due to the difference between the amount of thermal contraction of the sensor housing 80 in the radial direction ZB and the amount of thermal contraction of the magnetic shield 60 in the radial direction ZB. The first pressing force acts on the magnetic shield 60. Further, a force (hereinafter, referred to as "second pressing force") is applied by the sensor housing 80 to the magnetic shield 60 in the circumferential direction ZC due to the difference between the amount of thermal contraction of the sensor housing 80 in the circumferential direction ZC and the amount of thermal contraction of the magnetic shield 60 in the circumferential direction ZC. The second pressing force acts on the magnetic shield 60. The applicant found, as the result of FEM analysis, that the first pressing force is greater than the second pressing force in the torque detector 30.

In the torque detector 30, the second angle A2 is smaller than the first angle A1 at the magnetic shield 60. The second angle A2 is 0°. Thus, the direction in which the outer side face 61B of each of the shield end portions 61 extends coincides with the direction in which the first pressing force acts. Thus, the first pressing force is restrained from acting on the shield end portion 61. Therefore, it is possible to suppress generation of a reaction force (hereinafter referred to as "pressing reaction force") that is caused by the first pressing force and transmitted from the shield end portion 61 to the sensor housing 80.

Figure 12:
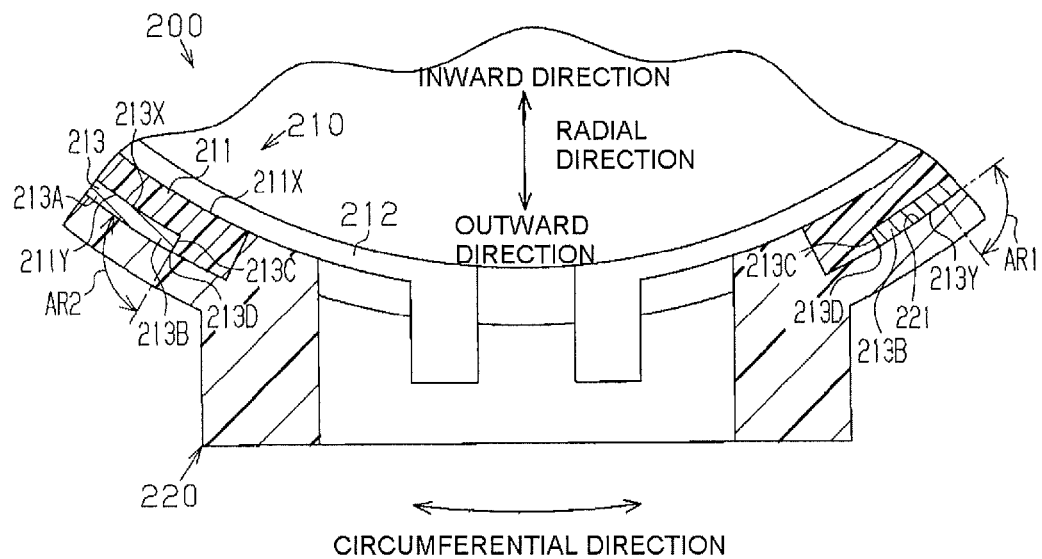
FIG. 12 is a sectional view illustrating the sectional configuration of part of a torque detector in a comparative example.
Figure 13:
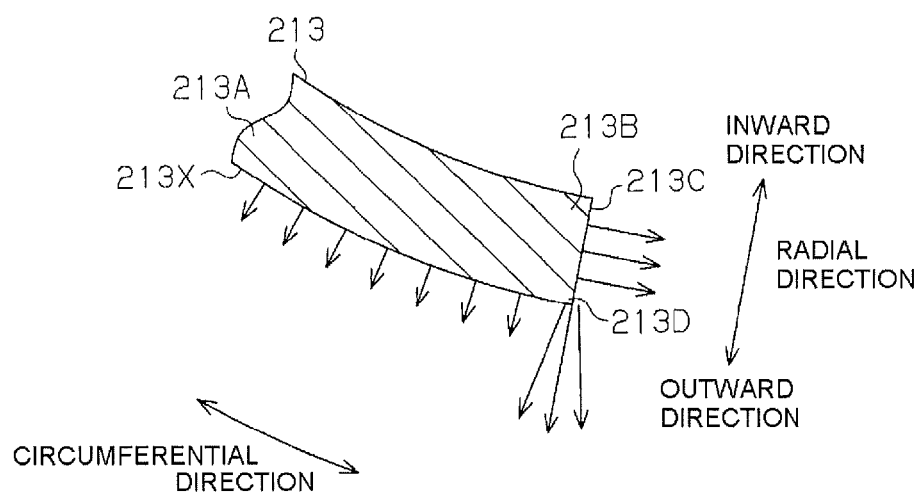
FIG. 13 is a sectional view illustrating a magnetic shield of the torque detector in the comparative example, and illustrating the sectional configuration of a shield end portion.

The first pressing force is restrained from acting on the corner portion 61C of each of the shield end portions 61 although the second pressing force acts on the corner portion 61C, when the torque detector 30 is cooled. The pressing reaction force at the corner portion 61C of each shield end portion 61 is smaller than the pressing reaction force at a corner portion 213D of each shield end portion 213B in a torque detector 200 illustrated in FIG. 12. Therefore, in the torque detector 30, it is possible to suppress generation of a large thermal stress in a portion of the sensor housing 80, which surrounds the shield end portion 61 from the side in the outward direction ZB2, more efficiently than in the torque detector 200.

Due to dimensional variations of the magnetic shields 60, the second angle A2 of some magnetic shields 60 may not strictly coincide with 0°. In this case, the first pressing force is resolved, at each of the shield end portions 61, into a component force in a direction along the outer side face 61B of the shield end portion 61 and a component force that perpendicularly presses the shield end portion 61. The component force that perpendicularly presses the shield end portion 61 is smaller than a force that perpendicularly presses the shield end portion 213B of the magnetic shield 213 in the torque detector 200. Thus, the pressing reaction force is smaller than that in the torque detector 200.

In addition, in the torque detector 30, the corner portion 61C of the shield end portion 61 overlaps with the bent portion 64 in the radial direction ZB. Thus, the first pressing force acts on the bent portion 64. That is, the first pressing force is restrained from directly acting on the corner portion 61C of the shield end portion 61. Further, the applicants found, as the result of the EFM analysis, that a reaction force transmitted from the outer side face 64A of the bent portion 64 to the sensor housing 80 in the torque detector 30 is smaller than the pressing reaction force in the torque detector 200. Therefore, in the sensor housing 80, it is possible to suppress generation of a large thermal stress in the portion that surrounds the shield end portion 61 from the side in the outward direction ZB2.

Figure 8A:
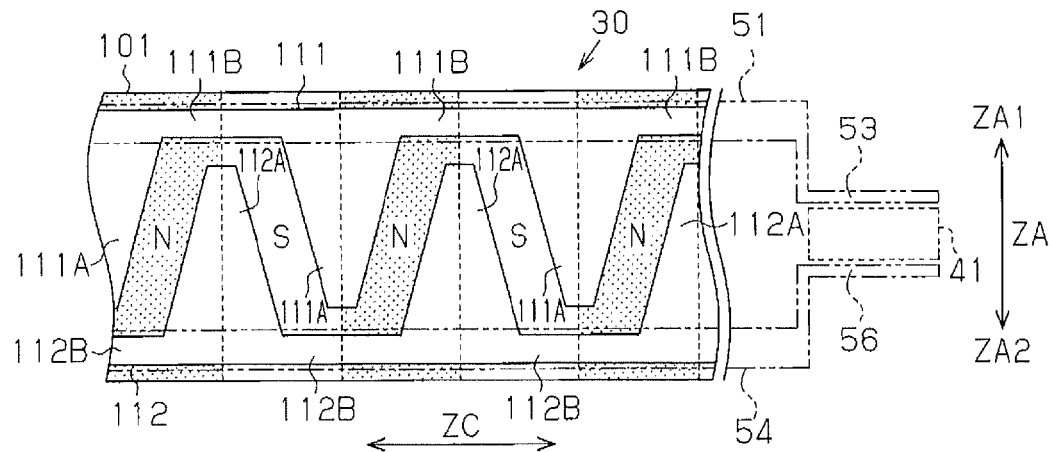
FIG. 8A is a development view illustrating the positional relationship between a permanent magnet and each magnetic yoke and each magnetic flux collecting ring in the torque detector according to the first embodiment.
Figure 8B:
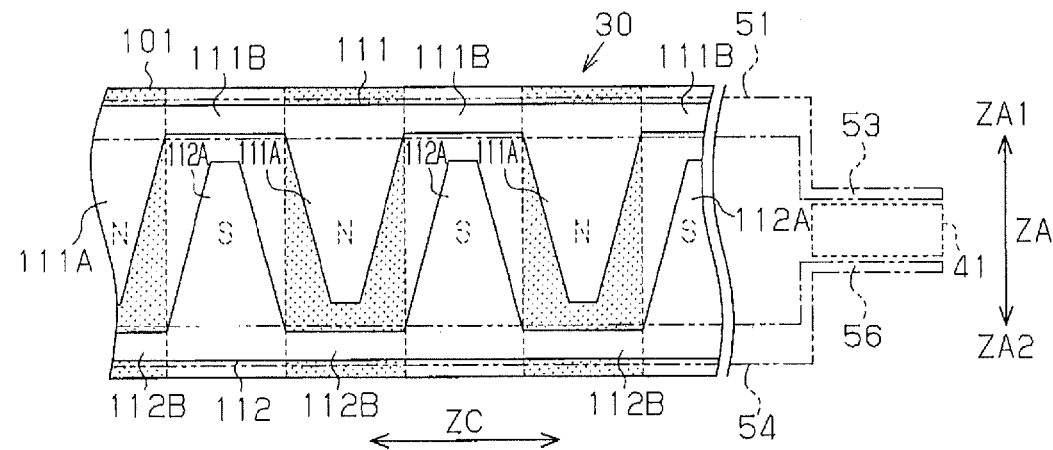
FIG. 8B is a development view illustrating the positional relationship between the permanent magnet and each magnetic yoke and each magnetic flux collecting ring in the torque detector according to the first embodiment.
Figure 8C:
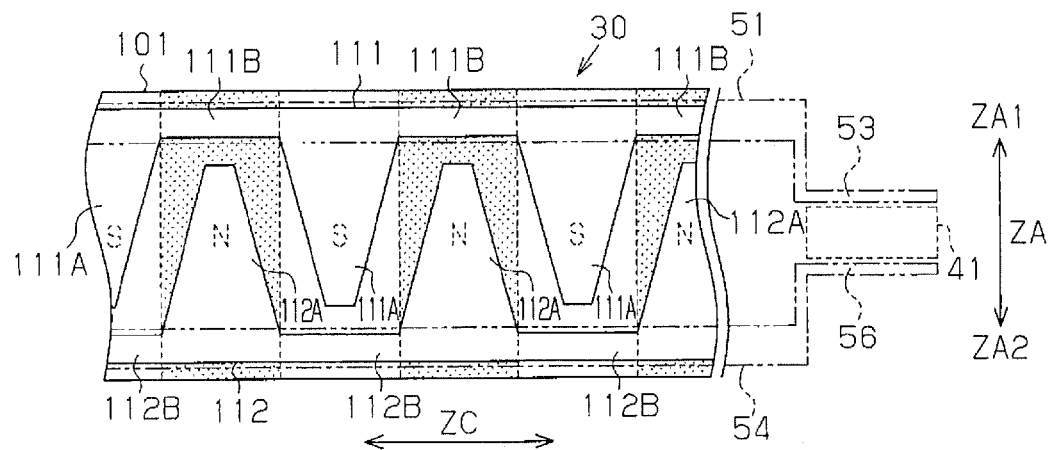
FIG. 8C is a development view illustrating the positional relationship between a permanent magnet and each magnetic yoke and each magnetic flux collecting ring in the torque detector according to the first embodiment.

With reference to FIG. 8A to FIG. 8C, the operation of the torque detector 30 for detecting a magnetic flux density will be described. FIG. 8A illustrates a state (hereinafter, referred to as "neutral state) in which no torque is applied between the first shaft 13A and the second shaft 13B (refer to FIG. 1). FIG. 8B illustrates a state (hereinafter, referred to as "clockwise rotation state") in which a clockwise torque is applied between the first shaft 13A and the second shaft 13B. FIG. 8C illustrates a state (hereinafter, referred to as "counterclockwise rotation state") in which a counterclockwise torque is applied between the first shaft 13A and the second shaft 13B.

As to the relationship between the magnetic yokes 111, 112 and the permanent magnet 101, a first north pole opposed area, a first south pole opposed area, a second north pole opposed area, and a second south pole opposed area are defined as follows.

The first north pole opposed area indicates an area in which the first magnetic yoke 111 and the north poles of the permanent magnet 101 are opposed to each other. The first south pole opposed area indicates an area in which the first magnetic yoke 111 and the south poles of the permanent magnet 101 are opposed to each other.

The second north pole opposed area indicates an area in which the second magnetic yoke 112 and the north poles of the permanent magnet 101 are opposed to each other. The second south pole opposed area indicates an area in which the second magnetic yoke 112 and the south poles of the permanent magnet 101 are opposed to each other.

As illustrated in FIG. 8A, in the neutral state, the distal end portions of the teeth 111A of the first magnetic yoke 111 and the distal end portions of the teeth 112A of the second magnetic yoke 112 are located at the boundaries between the north poles and the south poles of the permanent magnet 101. At this time, the first north pole opposed area and the first south pole opposed area are equal to each other. Further, the second north pole opposed area and the second south pole opposed area are equal to each other. Thus, no magnetic flux is produced between the magnetic flux collecting protrusions 53 of the first magnetic flux collecting ring 51 and the magnetic flux collecting protrusions 56 of the second magnetic flux collecting ring 54. Therefore, the voltage output from the magnetic sensors 41 exhibits zero.

As illustrated in FIG. 8B, in the clockwise rotation state, the torsion bar 13D (refer to FIG. 1) is twisted from its neutral position, and accordingly, the relative positions between the magnetic yokes 111, 112 and the permanent magnet 101 are changed. Thus, the first north pole opposed area becomes greater than the first south pole opposed area. Further, the second north pole opposed area becomes smaller than the second south pole opposed area. Therefore, the amount of magnetic flux flowing into the first magnetic yoke 111 from the north poles of the permanent magnet 101 is greater than the amount of magnetic flux flowing from first magnetic yoke 111 toward the south poles of the permanent magnet 101. Further, the amount of magnetic flux flowing into the second magnetic yoke 112 from the north poles of the permanent magnet 101 is smaller than the amount of magnetic flux flowing from the second magnetic yoke 112 toward the south poles of the permanent magnet 101. Thus, the magnetic flux flows from the magnetic flux collecting protrusions 53 of the first magnetic flux collecting ring 51 to the magnetic flux collecting protrusions 56 of the second magnetic flux collecting ring 54. Thus, the magnetic sensors 41 output voltages corresponding to the magnetic flux.

As illustrated in FIG. 8C, in the counterclockwise rotation state, the torsion bar 13D is twisted in the direction opposite from the direction in the clockwise rotation state, and accordingly, the relative positions between the magnetic yokes 111, 112 and the permanent magnet 101 are changed in the direction opposite from the direction in the clockwise rotation state. Thus, the first north pole opposed area becomes smaller than the first south pole opposed area. Further, the second north pole opposed area becomes greater than the second south pole opposed area. Therefore, the amount of magnetic flux flowing into the first magnetic yoke 111 from the north poles of the permanent magnet 101 is smaller than the amount of magnetic flux flowing from first magnetic yoke 111 toward the south poles of the permanent magnet 101. Further, the amount of magnetic flux flowing into the second magnetic yoke 112 from the north poles of the permanent magnet 101 is greater than the amount of magnetic flux flowing from the second magnetic yoke 112 toward the south poles of the permanent magnet 101. Thus, the magnetic flux flows from the magnetic flux collecting protrusions 56 of the second magnetic flux collecting ring 54 to the magnetic flux collecting protrusions 53 of the first magnetic flux collecting ring 51. Thus, the magnetic sensors 41 output voltages corresponding to the magnetic flux.

The steering system 1 in the present embodiment produces the following advantageous effects. The torque detector 30 includes the magnetic shield 60 with the second angle A2 smaller than the first angle A1. With this configuration, the first pressing force is restrained from acting on each of the shield end portions 61 of the magnetic shield 60. Thus, it is possible to suppress generation of a large thermal stress in the portion of the sensor housing 80, which surrounds the shield end portion 61 from the side in the outward direction ZB2.

The torque detector 30 is configured such that the shield positioning portions 65 of the magnetic shield 60 are fitted to the holder positioning portions 78 of the magnetic flux collecting holder 70. With this configuration, the magnetic shield 60 is positioned in the circumferential direction ZC with respect to the magnetic flux collecting holder 70. Thus, it is possible to restrain the position of the magnetic shield 60 with respect to the magnetic flux collecting holder 70 in the circumferential direction ZC from varying among products of the torque detector 30.

The magnetic shield 60 is configured such that each shield end portion 61 and a corresponding one of the bent portions 64 overlap with each other in the radial direction ZB. With this configuration, because the first pressing force acts on each of the bent portions 64, it is possible to restrain the first pressing force from acting on each of the shield end portions 61. Thus, it is possible to enhance the effect of restraining generation of a large thermal stress in the portion of the sensor housing 80, which surrounds each of the shield end portion 61 from the side in the outward direction ZB2.

Figure 9A:
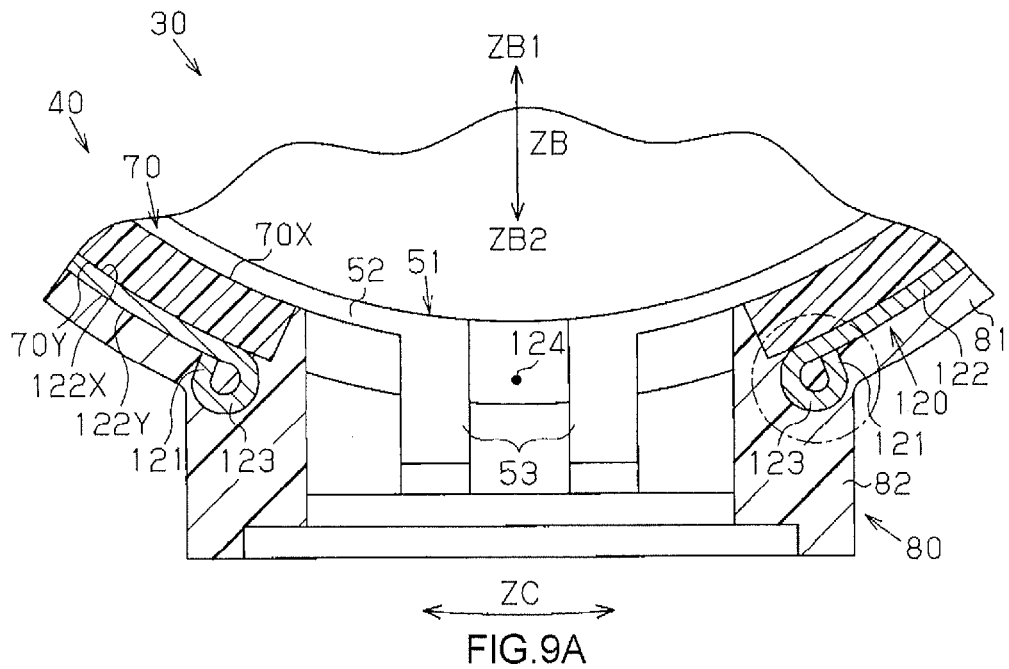
FIG. 9A is a sectional view illustrating a sensor unit according to a first embodiment of the invention, and illustrating the sectional configuration of a substrate support portion of a sensor housing and its surroundings.
Figure 9B:
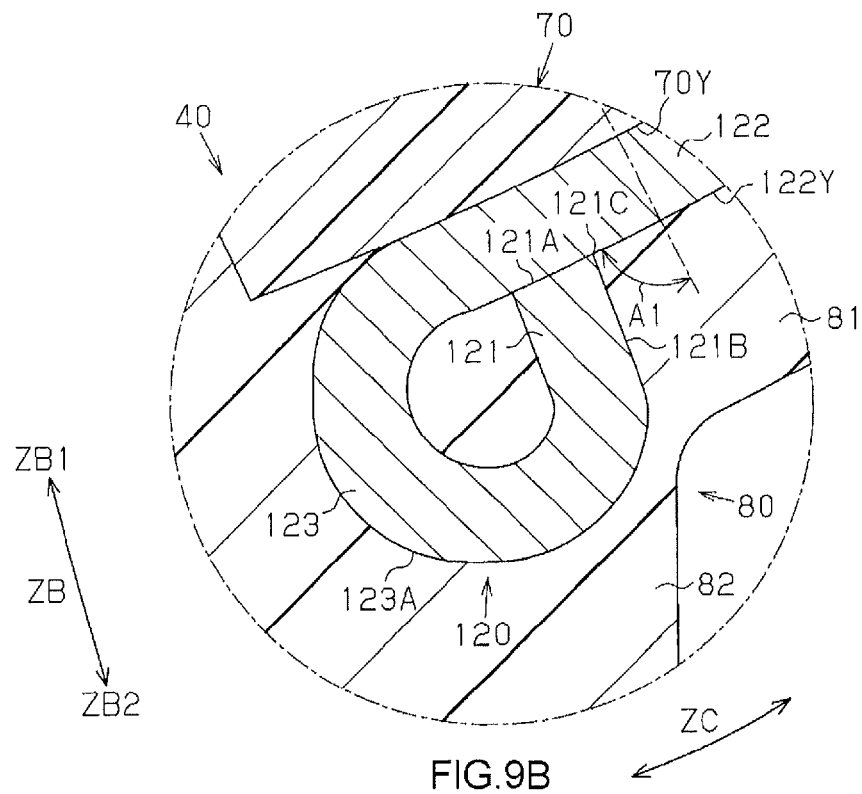
FIG. 9B is a sectional view illustrating the sensor unit according to the second embodiment, and an enlarged view illustrating the configuration of a portion indicated by a dashed line circle in FIG. 9A.

FIG. 9A and FIG. 9B illustrate a torque detector 30 according to a second embodiment of the invention. This torque detector 30 differs from the torque detector 30 in the first embodiment of the invention illustrated in FIG. 7, mainly in the following points. The shapes of shield end portions 121 and bent portions 123 of a magnetic shield 120 are different from those in the first embodiment. The accommodation portions 77 are omitted from the magnetic flux collecting holder 70. The shapes of portions of the sensor housing 80, which correspond to the shield end portions 121, are different from those in the first embodiment. Hereinafter, the differences from the torque detector 30 in the first embodiment will be described in detail, and the same reference numerals as those in the first embodiments will be assigned to the same configurations as those in the first embodiment and the explanation thereof will be partially or entirely omitted. FIG. 9A and FIG. 9B illustrate the sensor unit 40 from which the substrate unit 90 is omitted. The structure for positioning the magnetic shield 120 and the magnetic flux collecting holder 70 in the circumferential direction ZC is the same as the structure for positioning the magnetic shield 60 and the magnetic flux collecting holder 70 in the circumferential direction ZC in the first embodiment as illustrated in FIG. 6.

As illustrated in FIG. 9A, the magnetic shield 120 is formed by bending a long single metal plate that is a magnetic material. The magnetic shield 120 has the shield end portions 121, a shield body 122, bent portions 123 and a gap 124. The magnetic shield 120 is configured such that the shield body 122 is formed in a C-shape. The shield body 122 of the magnetic shield 120 is held between the outer peripheral face 70Y of the magnetic flux collecting holder 70 and the inner face 81C of the housing body 81 of the sensor housing 80. The magnetic shield 120 is configured such that the shield end portions 121 constitute end portions of the long plate in its longitudinal direction. The magnetic shield 120 is configured such that the gap 124 is formed between the shield end portions 121 that are adjacent to each other in the circumferential direction ZC.

Each of the bent portions 123 has such a shape as to be bent in the outward direction ZB2 from an end portion of the shield body 122 in the circumferential direction ZC and further bent toward the shield body 122. The bent portions 123 connect the shield body 122 and the shield end portions 121 to each other.

As illustrated in FIG. 9B, each of the shield end portions 121 extends from a corresponding one of the bent portions 123 toward the shield body 122. An end face 121A of each shield end portion 121 is in contact with an outer peripheral face 122Y of the shield body 122. Each corner portion 121C is formed of the end face 121A and an outer side face 121B of the shield end portion 121.

At the magnetic shield 120, a first angle A1 is an angle formed between the outer peripheral face 122Y of the shield body 122 and the radial direction ZB. At the magnetic shield 120, the second angle A2 is an angle formed between the outer side face 121B of each of the shield end portions 121 and the radial direction ZB. At the magnetic shield 120 in the present embodiment, because the outer peripheral face 122Y of the shield body 122 is orthogonal to the radial direction ZB, the first angle A1 is 90°. At the magnetic shield 120, because the outer side face 121B of the shield end portion 121 is parallel to the radial direction ZB, the second angle A2 is 0°.

The sensor housing 80 is in close contact with the outer peripheral face 122Y of the shield body 122, the outer side faces 121B and the corner portions 121C of the shield end portions 121, and outer side faces 123A of the bent portions 123.

The torque detector according to the invention and the steering system including the torque detector may be implemented in various embodiments other than the first and second embodiments. Hereinafter, modified examples of the first and second embodiments will be described as other embodiments of the torque detector according to the invention and the steering system including the torque detector. Note that the following modified examples may be combined with one another.

Figure 10:
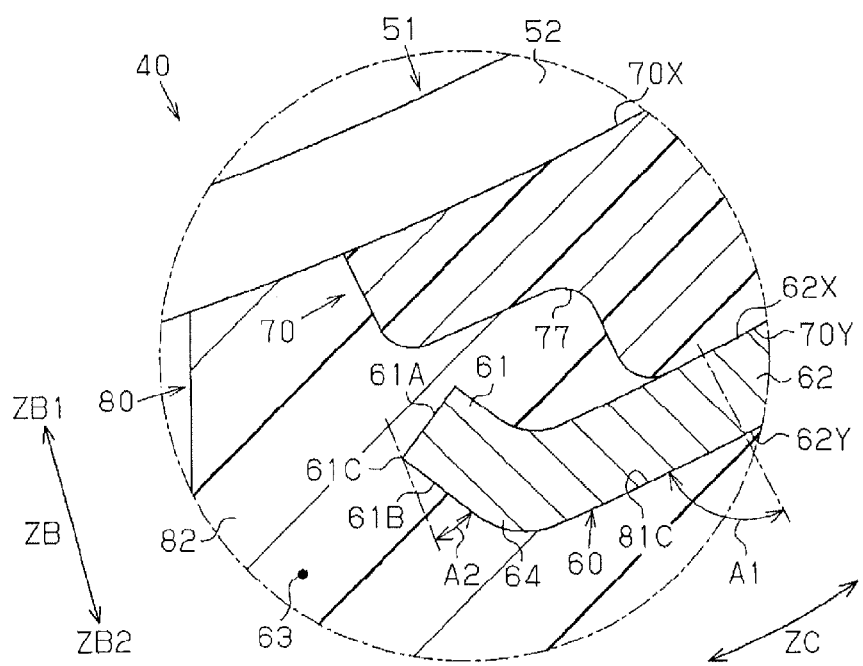
FIG. 10 is a sectional view illustrating a sensor unit according to another embodiment of the invention, and illustrating the sectional configuration of a shield end portion of a magnetic shield and its surroundings.

In the magnetic shield 60 in the first embodiment, the corner portion 61C of each shield end portion 61 overlaps with a corresponding one of the bent portions 64 in the radial direction ZB. However, the configuration of the magnetic shield 60 is not limited to the one described in the first embodiment. For example, in the magnetic shield 60 in a modified example, as illustrated in FIG. 10, the corner portions 61C of the shield end portions 61 are located at positions closer to the center of the gap 63 than the bent portions 64 in the circumferential direction ZC. That is, in the magnetic shield 60 in the modified example, the corner portions 61C of the shield end portions 61 are not overlapped with the bent portions 64 in the radial direction ZB. Each shield end portion 61 in the modified example is formed such that the distance between the shield end portion 61 and the center of the gap 63 in the circumferential direction ZC is reduced in the inward direction ZB1

With this configuration, the second angle A2 is smaller than the first angle A1. Thus, the outer side faces 61B of the shield end portions 61 are not orthogonal to the radial direction ZB. Therefore, the first pressing force is resolved, at each of the shield end portions 61, into a component force in a direction along the shield end portion 61 and a component force that perpendicularly presses the shield end portion 61. Therefore, the component force that perpendicularly presses the shield end portion 61 is smaller than the force that perpendicularly presses the shield end portion 213B of the magnetic shield 213 in the torque detector 200 in FIG. 12. Thus, it is possible to suppress generation of a large thermal stress in the portion of the sensor housing 80, which surrounds the shield end portion 61 from the side in the outward direction ZB2.

Figure 11:
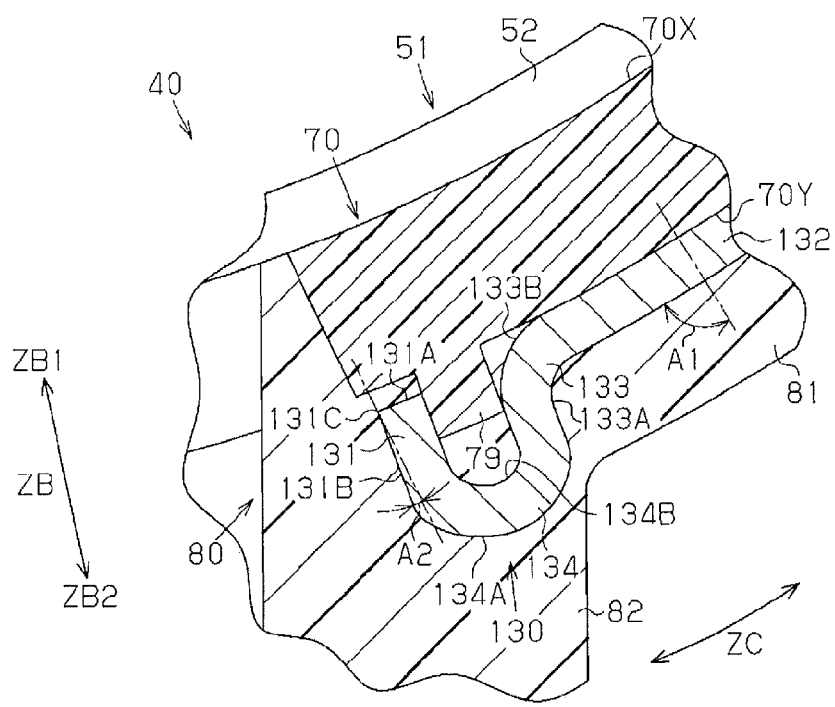
FIG. 11 is a sectional view illustrating a sensor unit according to another embodiment of the invention, and illustrating the sectional configuration of a shield end portion of a magnetic shield and its surroundings.

The magnetic shield 60 in the first embodiment is configured such that each of the shield end portions 61 is bent, at the bent portion 64, in the inward direction ZB1 from the shield body 62. However, the configuration of the magnetic shield 60 is not limited to the one described in the first embodiment. For example, as illustrated in FIG. 11, a magnetic shield 130 in a modified example has a first bent portion 133 and a second bent portion 134. The magnetic shield 130 in the modified example is configured such that a shield body 132, shield end portions 131 and the bent portions 133, 134 are formed integrally with each other. The first bent portion 133 is bent in the outward direction ZB2 from the shield body 132. The second bent portion 134 is continuous with the first bent portion 133. The second bent portion 134 has such a U-shape as to open in the inward direction ZB1. The shield end portion 131 is continuous with the second bent portion 134. The shield end portion 131 extends in the inward direction ZB1. The shield end portion 131 overlaps with the second bent portion 134 in the circumferential direction ZC.

The sensor housing 80 in the modified example is in close contact with an outer side face 133A and an inner side face 133B of each first bent portion 133, an outer side face 134A and an inner side face 134B of each second bent portion 134, and an end face 131A, an outer side face 131B and a corner portion 131C of each shield end portion 131.

The magnetic flux collecting holder 70 in the modified example has holder positioning portions 79 each of which is fitted in a portion defined by the first bent portion 133 and the second bent portion 134, instead of the holder positioning portions 78. The holder positioning portion 79 projects in the outward direction ZB2 from the outer peripheral face 70Y of the magnetic flux collecting holder 70.

The magnetic shield 60 in the modified example described above may be further modified such that the corner portion 131C of the shield end portion 131 does not overlap with the second bent portion 134 in the radial direction ZB. In the magnetic flux collecting holder 70 in the modified example described above, the holder positioning portions 79 may be omitted.

In the magnetic shield 120 in the second embodiment, the end face 121A of each shield end portion 121 is in contact with the outer peripheral face 122Y of the shield body 122. However, the configuration of the magnetic shield 120 is not limited to the one described in the second embodiment. For example, in the magnetic shield 120 in a modified example, the end face 121A of each shield end portion 121 is opposed across a gap to the outer peripheral face 122Y of the shield body 122 in the radial direction ZB.

In the magnetic flux collecting unit 50 in each of the first and second embodiments, the holder positioning portions 78 of the magnetic flux collecting holder 70, which are protrusions, are fitted to the shield positioning portions 65 of the magnetic shield 60, which are recessed portions. However, the structure for fitting the holder positioning portions 78 of the magnetic flux collecting holder 70 and the shield positioning portions 65 of the magnetic shield 60 is not limited to the one described in the first and second embodiments. For example, in the magnetic flux collecting unit 50 in a modified example, the holder positioning portions 78 of the magnetic flux collecting holder 70, which are recessed portions, are fitted to the shield positioning portions 65 of the magnetic shield 60, which are protrusions.

In the magnetic flux collecting unit 50 in each of the first and second embodiments, the magnetic flux collecting holder 70 has the two holder positioning portions 78, and the magnetic shield 60 has the two shield positioning portions 65. However, the number of the positioning portions in the magnetic flux collecting unit 50 is not limited to the one described in the first and second embodiments. For example, in the magnetic flux collecting unit 50 in a modified example, the magnetic flux collecting holder 70 has one holder positioning portion 78 or three or more holder positioning portions 78, and the magnetic shield 60 has one shield positioning portion 65 or three or more shield positioning portion 65.

The magnetic flux collecting unit 50 in the first and second embodiments has one magnetic shield 60 or 120. However, the configuration of the magnetic flux collecting unit 50 is not limited to the one described in these embodiments. For example, the magnetic flux collecting unit 50 in a modified example has the magnetic shield that is split into a plurality of magnetic shield pieces in the axial direction ZA.

In the magnetic flux collecting unit 50 in each of the first and second embodiments, the first magnetic flux collecting ring 51 and the second magnetic flux collecting ring 54 are attached to the holding protrusion 71 of the magnetic flux collecting holder 70. However, the configuration of the magnetic flux collecting holder 70 is not limited to the one described in the first and second embodiments. For example, in the magnetic flux collecting unit 50 in a modified example, the magnetic flux collecting holder 70 is integrally formed with the magnetic flux collecting rings 51, 54. The magnetic flux collecting holder 70 in the modified example does not have the holding protrusion 71 and the through-holes 74.

The torque detector 30 in each of the first and second embodiments includes two magnetic sensors 41. However, the number of magnetic sensors 41 is not limited to the one described in the first and second embodiments. For example, the torque detector 30 in a modified example has a single magnetic sensor 41. In the torque detector 30 in the modified example, the first magnetic flux collecting ring 51 has a single magnetic flux collecting protrusion 53, and the second magnetic flux collecting ring 54 has a single magnetic flux collecting protrusion 56.

In the torque detector 30 in each of the first and second embodiments, Hall ICs are used as the magnetic sensors 41. However, the configuration of the magnetic sensors 41 is not limited to the one described in these embodiments. For example, in the torque detector 30 in a modified example, Hall elements or MR elements are used as the magnetic sensors 41, instead of Hall ICs.

The steering system 1 in each of the embodiments 1 and 2 has a configuration as an electric power steering system of a dual pinion assist type. On the other hand, a steering system 1 in a modified example has a configuration as an electric power steering system of a column assist type, a pinion assist type, a rack parallel type or a rack coaxial type.

The steering system 1 in each of the first and second embodiments has a configuration as an electric power steering system including the assist device 20. On the other hand, a steering system in a modified example has a configuration as a mechanical steering system that does not include the assist device 20.

In other words, the steering system according to the invention may be applied to any steering systems that include a rack shaft and a pinion shaft, for example, electric power steering systems other than an electric power steering system of a dual pinion assist type, and steering systems other than an electric power steering system.

Next, the configuration of the torque detector that can be understood from the above-described embodiments will be described. There is provided a torque detector in which a shield end portion and a bent portion overlap with each other in the radial direction of a sensor housing.

With this configuration, because the first pressing force acts on the bent portion, it is possible to restrain the first pressing force from acting on the shield end portion. Thus, it is possible to enhance the effect of restraining generation of a large thermal stress in a portion of the sensor housing, which is outward of the magnetic shield.

What is claimed is:

1. A torque detector comprising:
    a permanent magnet;
    a magnetic yoke that is arranged in a magnetic field created by the permanent magnet, and of which a position relative to the permanent magnet varies;
    a magnetic flux collecting unit including a magnetic flux collecting holder formed in an annular shape by resin molding and surrounding the magnetic yoke, a magnetic flux collecting ring that is attached to an inner peripheral face of the magnetic flux collecting holder and that collects magnetic fluxes of the magnetic yoke, and a magnetic shield formed by bending a metal plate and attached to an outer peripheral face of the magnetic flux collecting holder;
    a magnetic sensor that detects a magnetic flux of a magnetic circuit formed by the permanent magnet, the magnetic yoke and the magnetic flux collecting ring; and
    a sensor housing, wherein resin is supplied to an outer periphery of the magnetic shield so that the sensor housing is formed integrally with the magnetic flux collecting unit, wherein
    the magnetic shield has a shield body held between an inner face of the sensor housing and the outer peripheral face of the magnetic flux collecting holder, a shield end portion constituting an end portion of the metal plate in a circumferential direction, and a bent portion bent from the shield body and connecting the shield body and the shield end portion to each other, and
    a second angle formed between an outer side face of the shield end portion and a radial direction of the sensor housing is smaller than a first angle formed between an outer peripheral face of the shield body and the radial direction of the sensor housing.

2. The torque detector according to claim 1, wherein the shield end portion is extended toward the magnetic flux collecting ring beyond the outer peripheral face of the shield body due to the bent portion.

3. The torque detector according to claim 2, wherein:
    the magnetic shield has a shield positioning portion formed in the shield body;
    the magnetic flux collecting holder has a holder positioning portion; and
    the shield positioning portion is fitted to the holder positioning portion to restrain a relative position between the magnetic shield and the magnetic flux collecting holder from being changed in a circumferential direction of the magnetic flux collecting unit.

4. A steering system comprising the torque detector according to claim 3.

5. A steering system comprising the torque detector according to claim 2.

6. The torque detector according to claim 1, wherein the bent portion is bent from the shield body in a direction away from the magnetic flux collecting ring, and is then bent toward the shield body, and the shield end portion extends toward the shield body.

7. The torque detector according to claim 6, wherein
    the magnetic shield has a shield positioning portion formed in the shield body;
    the magnetic flux collecting holder has a holder positioning portion; and
    the shield positioning portion is fitted to the holder positioning portion to restrain a relative position between the magnetic shield and the magnetic flux collecting holder from being changed in a circumferential direction of the magnetic flux collecting unit.

8. A steering system comprising the torque detector according to claim 7.

9. A steering system comprising the torque detector according to claim 6.

10. The torque detector according to claim 1, wherein:

the magnetic shield has a shield positioning portion formed in the shield body;

the magnetic flux collecting holder has a holder positioning portion; and the shield positioning portion is fitted to the holder positioning portion to restrain a relative position between the magnetic shield and the magnetic flux collecting holder from being changed in a circumferential direction of the magnetic flux collecting unit.

11. A steering system comprising the torque detector according to claim 10.

12. A steering system comprising the torque detector according to claim 1.

\* \* \* \* \*